United States Patent
Prenat et al.

(10) Patent No.: US 9,437,260 B2
(45) Date of Patent: Sep. 6, 2016

(54) REPROGRAMMABLE LOGIC DEVICE RESISTANT TO RADIATIONS

(71) Applicants: Commissariat à l'Energie Atomique et aux Energies Alternatives, Paris (FR); CENTRE NATIONAL DE LA RECHERCHE SCIENTIFIQUE, Paris (FR)

(72) Inventors: Guillaume Prenat, Grenoble (FR); Olivier Goncalves, Antony (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 14/395,555

(22) PCT Filed: Apr. 24, 2013

(86) PCT No.: PCT/FR2013/050910
§ 371 (c)(1),
(2) Date: Oct. 20, 2014

(87) PCT Pub. No.: WO2013/160615
PCT Pub. Date: Oct. 31, 2013

(65) Prior Publication Data
US 2015/0084671 A1 Mar. 26, 2015

(30) Foreign Application Priority Data
Apr. 27, 2012 (FR) .................. 12 53926

(51) Int. Cl.
*G11C 7/10* (2006.01)
*H03K 19/003* (2006.01)
*H03K 19/177* (2006.01)

(52) U.S. Cl.
CPC ......... *G11C 7/1045* (2013.01); *H03K 19/0033* (2013.01); *H03K 19/1776* (2013.01); *H03K 19/1778* (2013.01); *H03K 19/17764* (2013.01); *H03K 19/17776* (2013.01)

(58) Field of Classification Search
None
See application file for complete search history.

(56) References Cited

U.S. PATENT DOCUMENTS 6,172,899 B1 * 1/2001 Marr et al. .................. 365/154
6,457,108 B1 * 9/2002 Hsu .......................... G11C 7/20
257/E21.209

(Continued)

OTHER PUBLICATIONS

Guillemenet et al., "A Non-Volatile Run-Time FPGA Using Thermally Assisted Switching Mrams," Field Programmable Logic and Applications, 2008, International Conference on, IEEE, Piscataway, NJ USA, Sep. 8, 2008.

(Continued)

*Primary Examiner* — Crystal L Hammond
(74) *Attorney, Agent, or Firm* — The Noblitt Group, PLLC (57) ABSTRACT

The invention relates to a reprogrammable logic device comprising a plurality of elementary patches, each patch comprising: at least one logic block configurable by one or more volatile memory cells storing configuration data; and a memory comprising: a plurality of non-volatile memory cells storing refresh data, each non-volatile memory cell comprising first and second resistance-switching elements, each being programmable so as to have one of a first and of a second resistance value representative of the refresh data; and a read-write circuit adapted for periodically refreshing the configuration data on the basis of the refresh data.

16 Claims, 6 Drawing Sheets

(56) References Cited

U.S. PATENT DOCUMENTS

| | | | |
|---|---|---|---|
| 6,973,003 B1* | 12/2005 | Salleh | G11C 11/406 365/189.05 |
| 7,760,538 B1* | 7/2010 | Paak | 365/148 |
| 7,764,081 B1* | 7/2010 | Tuan | H03K 19/007 326/14 |
| 7,796,417 B1* | 9/2010 | Lewis | 365/148 |
| 8,508,983 B2* | 8/2013 | Wang et al. | 365/154 |
| 8,773,896 B2* | 7/2014 | Shukh | 365/154 |
| 9,042,157 B2* | 5/2015 | Guillemenet et al. | 365/148 |
| 9,053,782 B2* | 6/2015 | Guillemenet et al. | |
| 9,059,705 B1* | 6/2015 | Edelhaeuser | H03K 19/177 |
| 2003/0122578 A1* | 7/2003 | Masui | G06F 21/76 326/39 |
| 2004/0125643 A1* | 7/2004 | Kang et al. | 365/148 |
| 2004/0141363 A1* | 7/2004 | Ohtsuka et al. | 365/154 |
| 2004/0222817 A1* | 11/2004 | Madurawe | H01L 27/105 326/39 |
| 2006/0181916 A1* | 8/2006 | Roehr | 365/148 |
| 2007/0041242 A1* | 2/2007 | Okazaki et al. | 365/154 |
| 2008/0247249 A1* | 10/2008 | Lee | G11C 5/025 365/205 |
| 2009/0109734 A1* | 4/2009 | Hanafi | 365/158 |
| 2009/0268513 A1* | 10/2009 | De Ambroggi et al. | 365/163 |
| 2010/0080042 A1* | 4/2010 | Lamorey | 365/148 |
| 2010/0188891 A1* | 7/2010 | Taniguchi et al. | 365/158 |
| 2010/0202191 A1* | 8/2010 | Ahn et al. | 365/154 |
| 2010/0271866 A1* | 10/2010 | Sakimura et al. | 365/158 |
| 2011/0085372 A1* | 4/2011 | Fackenthal | 365/156 |
| 2011/0122709 A1* | 5/2011 | Kim et al. | 365/189.05 |
| 2014/0269003 A1* | 9/2014 | Guillemenet et al. | 365/148 |

OTHER PUBLICATIONS

Grynkewich et al., "Nonvolatile Magnetoresistive Random-Access Memory Based on Magnetic Tunnel Junctions," MRS Bulletin, Pittsburgh, PA, US, No. 11, 1 Nov. 2004, pp. 818-821.

Black, Jr. et al., "Programmable Logic Using Giant-Magnetoresistance and Spin-Dependent Tunneling Devices" J. Appl. Phys., vol. 87, pp. 6674-6679, 2000.

* cited by examiner

REPROGRAMMABLE LOGIC DEVICE RESISTANT TO RADIATIONS

FIELD

The present invention relates to a reprogrammable logic device, and to a method of refreshing such a device.

BACKGROUND

Reprogrammable logic devices, such as FPGAs (field programmable gate arrays), are devices that are configurable to perform a certain logic function. Such devices generally comprise millions of static random access memory (SRAM) cells, each storing configuration data for configuring the logic function to be implemented.

Radiation, for example in the form of cosmic particles, can create errors in electronic devices, and are particularly problematic in the case of reprogrammable logic devices. Indeed the radiation may cause errors not only in the data that is being processed, but also in the configuration data, resulting in a change of the logic function implemented by the circuit.

US patent publication U.S. Pat. No. 7,764,081 proposes a solution for protecting a reprogrammable logic device from errors due to single event upsets (SEUs). According to this solution, the SRAM cells that store the configuration data in the reprogrammable logic device are replaced by DRAM (dynamic random access memory) cells, which are periodically refreshed from a PROM (programmable read-only memory).

However, a problem with the solution proposed by U.S. Pat. No. 7,764,081 is that it is relatively complex and energy consuming. There is thus a need in the art for a simple and low energy consuming solution for protecting a reprogrammable logic device from errors caused by radiation.

SUMMARY

It is an aim of embodiments of the present disclosure to at least partially address one or more problems in the prior art.

According to one aspect, there is provided a reprogrammable logic device comprising a plurality of tiles, each tile comprising: at least one logic block configurable by one or more volatile memory cells storing configuration data; and a memory comprising: a plurality of non-volatile memory cells storing refresh data, each non-volatile memory cell comprising first and second resistance switching elements each programmable to have one of first and second resistance values representative of said refresh data; and read-write circuitry adapted to periodically refresh said configuration data based on said refresh data.

According to one embodiment, said one or more volatile memory cells each comprises a capacitance for storing a voltage state representative of said configuration data.

According to one embodiment, each of a first and a second of the non-volatile memory cells is coupled to a first and a second node of the read-write circuitry, and the read-write circuitry is adapted to periodically refresh the configuration data of a first of the volatile memory cells based on the refresh data stored by the first non-volatile memory cell, and to periodically refresh the configuration data of a second of the volatile memory cells based on the refresh data stored by the second non-volatile memory cell.

According to another embodiment, each of said volatile memory cells comprises a selection transistor, and each of said first and second resistance switching elements is coupled in series with a further selection transistor.

According to another embodiment, a refresh data bit stored by each of said non-volatile memory cells is determined by the relative resistances of the first and second resistance switching elements.

According to another embodiment, said configuration data controls one or more of: the data values in a lookup table of said logic block; the selection of input lines of said logic block; and the selection of output lines of said logic block.

According to another embodiment, said memory further comprises an activation module for selectively activating said memory.

According to another embodiment, said read-write circuitry comprises a latch comprising first and second transistors, wherein a first terminal of the first resistance switching element of each of said plurality of non-volatile memory cells is coupled to said first transistor, and a first terminal of the second resistance switching element of each of said plurality of non-volatile memory cells is coupled to said second transistor.

According to another embodiment, the device further comprises a control circuit, and said first transistor is coupled between a first storage node and a first supply voltage, said second transistor is coupled between a second storage node and said first supply voltage, a control terminal of said first transistor being coupled to said second storage node, and a control terminal of said second transistor being coupled to said first storage node, and said control circuit is adapted to apply, during a programming phase of the first resistance switching element, a second supply voltage to said second storage node to active said first transistor, and then to apply said second supply voltage to said first storage node to generate a first write current through said first transistor and said first resistance switching element.

According to another embodiment, said control circuit is further adapted to isolate said second storage node from said second supply voltage, and then to apply, during a programming phase of the second resistance switching element, said second supply voltage to said second storage node to generate a second write current through said second transistor and said second resistance switching element.

According to another embodiment, said memory further comprises a third transistor coupling said first storage node to said second supply voltage and a fourth transistor coupling said second storage node to said second supply voltage.

According to another embodiment, said third transistor is adapted to have a lower threshold voltage than said first transistor and said fourth transistor is adapted to have a lower threshold voltage than said second transistor.

According to another embodiment, said at least one memory cell further comprises a fifth transistor coupled between said first and second storage nodes.

According to another embodiment, the reprogrammable device further comprises: a plurality of said tiles; and a controller adapted to control at least the activation of said memory of each of said tiles and the refreshing of the configuration data of each of said tiles.

According to another embodiment, said first and second resistance switching elements are one of: thermally assisted switching (TAS) elements; oxide resistive elements; conductive bridging elements; phase change elements; programmable metallization elements; spin transfer torque elements; and field-induced magnetic switching (FIMS) elements.

According to a further aspect, there is provided a method of refreshing a reprogrammable device comprising a plurality of tiles, each tile comprising at least one logic block comprising one or more inputs coupled to one or more volatile memory cells storing configuration data, the method comprising: periodically refreshing said configuration data based on refresh data stored in non-volatile memory cells of a memory, wherein each non-volatile memory cell comprises first and second resistance switching elements each programmable to have one of first and second resistance values.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

Throughout the drawings, unless otherwise stated, like features have been designated with like reference numerals.

DETAILED DESCRIPTION

Figure 1:
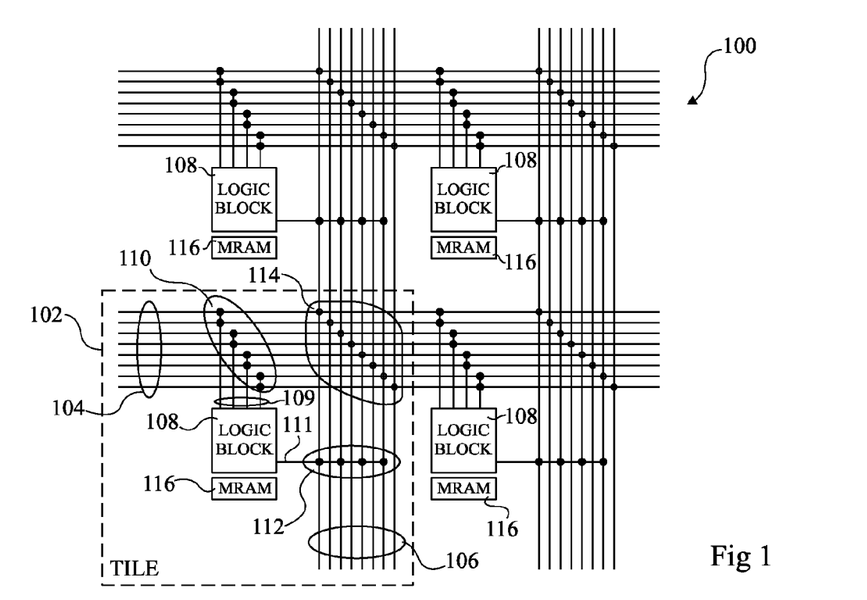
FIG. 1 schematically illustrates part of a reprogrammable memory device according to an example embodiment.

FIG. 1 illustrates part of a reprogrammable device 100 according to an example embodiment.

In the example of FIG. 1, the device is an FPGA (field programmable gate array) formed of an array of tiles 102, of which four adjacent tiles are illustrated. In practise, there may be many more than four tiles in the reprogrammable logic device, for example thousands of tiles.

Each of the tiles 102 comprises row lines 104 and column lines 106, in the example of FIG. 1 there being eight row lines 104 and eight column lines 106, although in alternative embodiments there could be a different number, for example 16, 32 or 64 row and column lines.

Each tile 102 also comprises a logic block 108 adapted to perform a logic function. In the example of FIG. 1, the logic block comprises four input lines 109, each of which may be selectively connected to one of the row lines 104. In particular, a programmable interconnection 110 is provided, which permits each of the input lines 109 to be connected to a selected one of the row lines 104, and in the example of FIG. 1, each of the four input lines 109 may be connected to one of a different pair of the eight row lines 104.

The logic block 108 performs a logic function on the data present on the input lines 109 to generate output data on an output line 111. The output line 111 may be selectively connected to one of the column lines 106. In particular, a programmable interconnection 112 is provided that permits the output line 111 to be connected to a selected one of the column lines 106, and in the example of FIG. 1, the output line 111 may be coupled to one of a first, third, fifth or seventh of the column lines 106.

Each of the tiles 102 further comprises programmable routing switches 114, permitting each of the row lines 104 to be selectively connected to corresponding row and/or column lines of adjacent tiles. In particular, in the example of FIG. 1, the programmable routing switches 114 permit each of the row lines 104 to be connected to a corresponding row line of the tile to the right in the figure, to a corresponding column line of the tile above in the figure, and/or to a corresponding column line of the tile below in the figure.

Each of the tiles 102 further comprises an MRAM (magnetoresistive random access memory) 116. The MRAM 116 stores configuration data that configures the interconnections 110, 112 and switch 114, as well as the logic function applied by the logic block 108.

Figure 2:
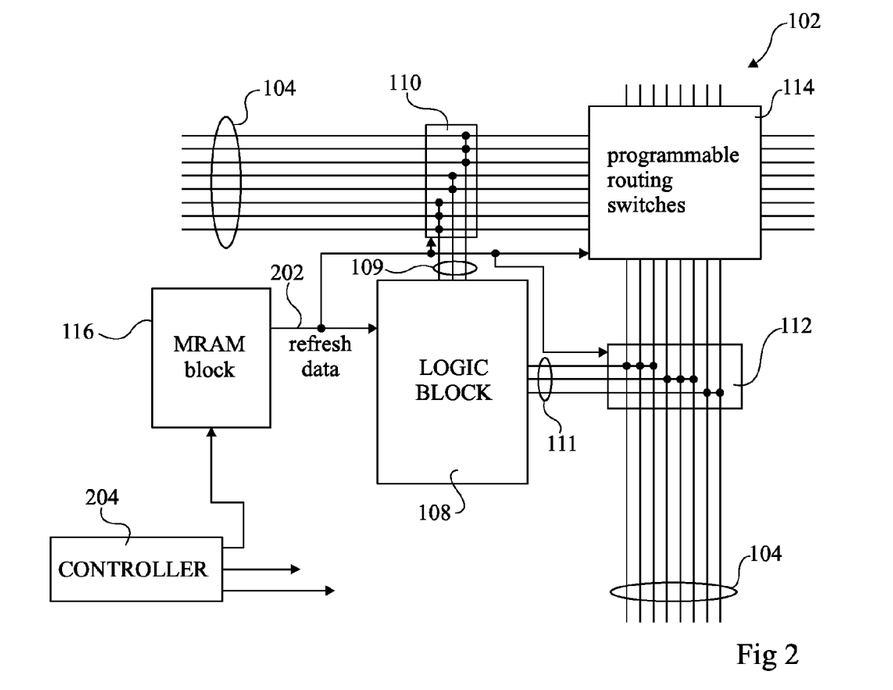
FIG. 2 schematically illustrates a tile of FIG. 1 in more detail according to an example embodiment.

FIG. 2 illustrates the tile 102 of FIG. 1 in more detail according to an example embodiment. As illustrated, the MRAM 116 provides refresh data on a line 202 to the logic block 108, to the programmable interconnections 110 and 112 and to the programmable routing switch 114. In the example of FIG. 2, the logic block 108 comprises three input lines 109 and three output lines 111, and the interconnections 110 and 112 each permit two of the respective input/output lines to be selectively connected to one line of a corresponding group of three of the row/column lines 104, 106, and the third of these respective input/output lines to be selectively connected to one of a corresponding pair of the row and column lines 104, 106.

A controller 204, which for example does not form part of the tile 102, provides control signals to the MRAM 116, and for example also provides control signals to other MRAMs 116 of other tiles of the reprogrammable logic device.

Figure 3A:
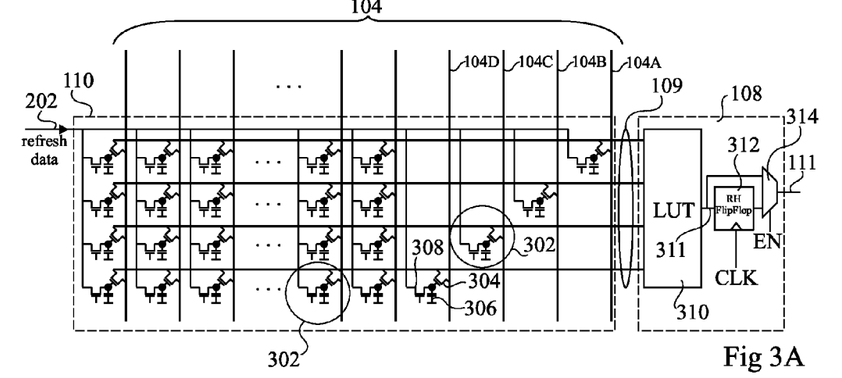
FIG. 3A schematically illustrates part of the tile of FIG. 2 in more detail according to an example embodiment.

FIG. 3A illustrates the programmable interconnection 110 and the logic block 108 of FIG. 1 in more detail according to an example embodiment. As illustrated, in this example, there are four input lines 109 to the logic block 108, and more than eight row lines 104. The programmable interconnection 110 comprises a programmable node 302 at the intersection of each input line 109 and each row line 104 where a connection may be programmed. In the example of FIG. 3A, four of the row lines 104A to 104D are each selectively connected by programmable nodes 302 to each of the four input lines 109 respectively. The other row lines are for example each selectively connected by programmable nodes 302 to each of the input lines 109.

Each of the programmable nodes 302 comprises a volatile memory cell, such as a DRAM cell. In particular, each node 302 comprises a transistor 304, for example an N-channel MOS (NMOS) transistor, coupled by its main current nodes between the corresponding row line and input line, and having its gate coupled to ground via a capacitance 306 and to the refresh data line 202 via a selection transistor 308, which again is for example an NMOS transistor. While not illustrated in FIG. 3A, the transistor 308 of each programmable node receives a corresponding selection signal SELn, described in more detail below. The capacitance 306 may correspond to a small capacitor, for example in the region of 1 to 100 fF or alternatively it may correspond to parasitic capacitances associated with transistors 304 and 308.

The logic block 108 for example comprises a lookup table 310, in this example having a single output line 311 coupled to a flip-flop 312, which is for example an RH (radiation hardened) flip-flop, and to one input of a two-input multiplexer 314. The output of flip-flop 312 is coupled to the other input of multiplexer 314, and the output of multiplexer 314 provides the output signal on line 111 of the logic block 108. Multiplexer 314 is controlled by a signal EN, described in more detail below. Thus the multiplexer 314 is for example controlled such that, when the tile 102 is activated, it will have either a sequential behaviour if the output of the flip-flop 312 is selected, or a combinational behaviour, if the output of the look-up table 310 is selected. When the tile is deactivated, the flip-flop 312 will be in a determined and constant state.

Figure 3B:
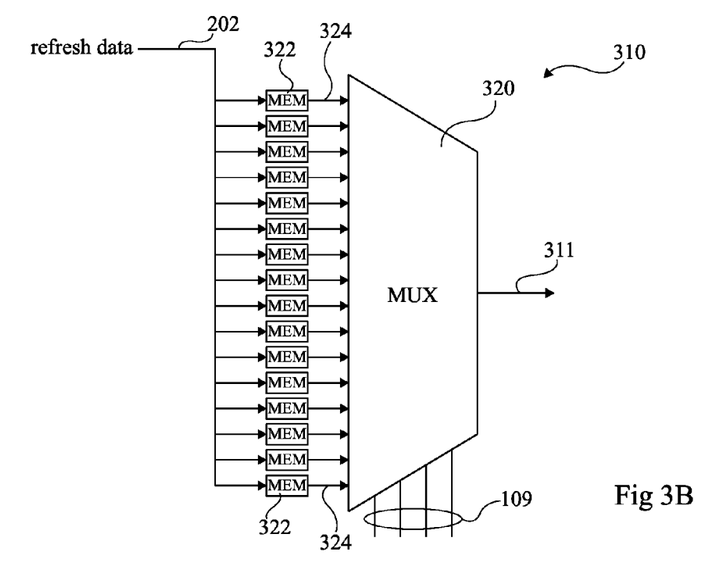
FIG. 3B schematically illustrates a lookup table of FIG. 3A in more detail according to an example embodiment.

FIG. 3B illustrates the lookup table 310 of FIG. 3A in more detail. As illustrated, the lookup table 310 for example comprises a multiplexer 320, which receives the input lines 109 as selection signals. In the case of a lookup table having four input lines 109, the multiplexer for example has 16 input lines 324, each for example being coupled to a volatile memory cell 322, which receives the refresh data signal on line 202.

Figure 3C:
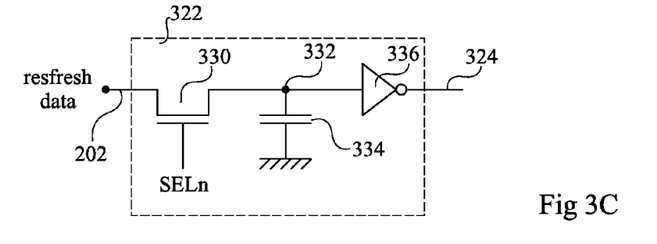
FIG. 3C schematically illustrates a volatile memory cell of FIG. 3B in more detail according to an example embodiment.

FIG. 3C illustrates one of the volatile memory cells 322 in more detail, which are for example DRAM cells. As illustrated, cell 322 for example comprises a transistor 330, for example an NMOS transistor, coupled between the refresh data line 222 and a node 332. The gate of transistor 330 receives a selection signal SELn, described in more detail below. Node 332 is further coupled to ground via a capacitance 334, and to the input line 324 of the multiplexer 320 via an inverter 336. The capacitance 334 is for example a small capacitor, for example in the region of 1 to 100 fF or alternatively it may correspond to parasitic capacitances associated with transistor 332 and inverter 336.

Figure 3D:
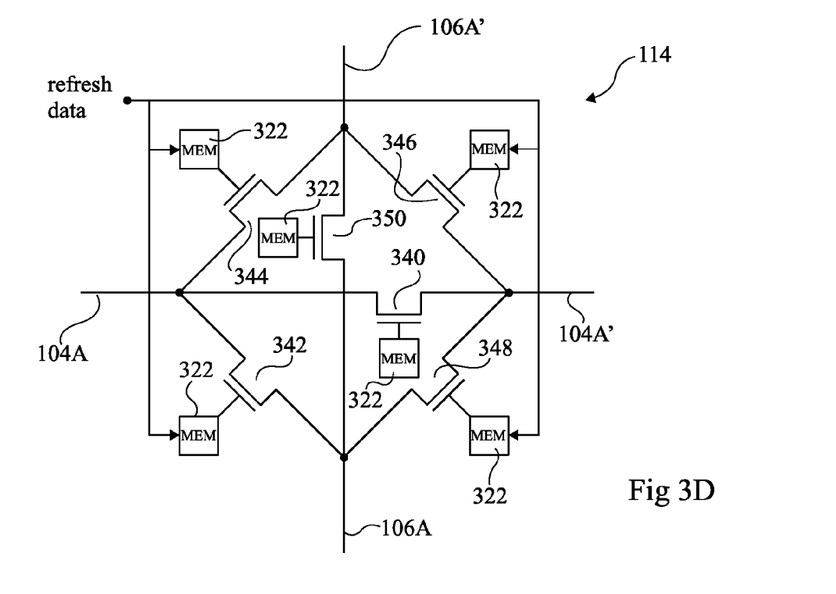
FIG. 3D schematically illustrates a programmable routing switch of the tile of FIG. 2 in more detail according to an example embodiment.

FIG. 3D illustrates the programmable routing switch 114 in more detail according to one example. As illustrated, the switch 114 in this example receives a first row line 104A and a first column line 106A of a tile 102, and also a first row line 104A' of a tile to the right (not illustrated in FIG. 3D), and a first column line 106A' of a tile above (again not illustrated in FIG. 3D). Line 104A is coupled to line 104A' via a transistor 340, to line 106A via a transistor 342, and to line 106A' via a transistor 344. Line 104A' is coupled to line 106A' via a transistor 346, and to line 106A via a transistor 348. Line 106A is coupled to line 106A' via a transistor 350. Transistors 340 to 350 are each for example NMOS transistors, and each has its gate coupled to a corresponding volatile memory cell 322, which for example corresponds to the memory cell illustrated in FIG. 3C, but without the inverter 336. Each memory cell 322 receives the refresh data signal on line 202.

Thus, as described above in relation to FIGS. 3A to 3D, the various volatile memory cells are used to configure connections or data values used by the tile 102, and the configuration data bit stored by each cell is refreshed via a transistor of each memory cell controlled by a corresponding selection signal SELn. Assuming a total number N+1 of volatile memory cells in the tile 102, there are thus selection signals SEL0 to SELN for controlling each of the memory cells. A refresh operation based on these selection signals will now be described with reference to FIG. 4.

Figure 4:
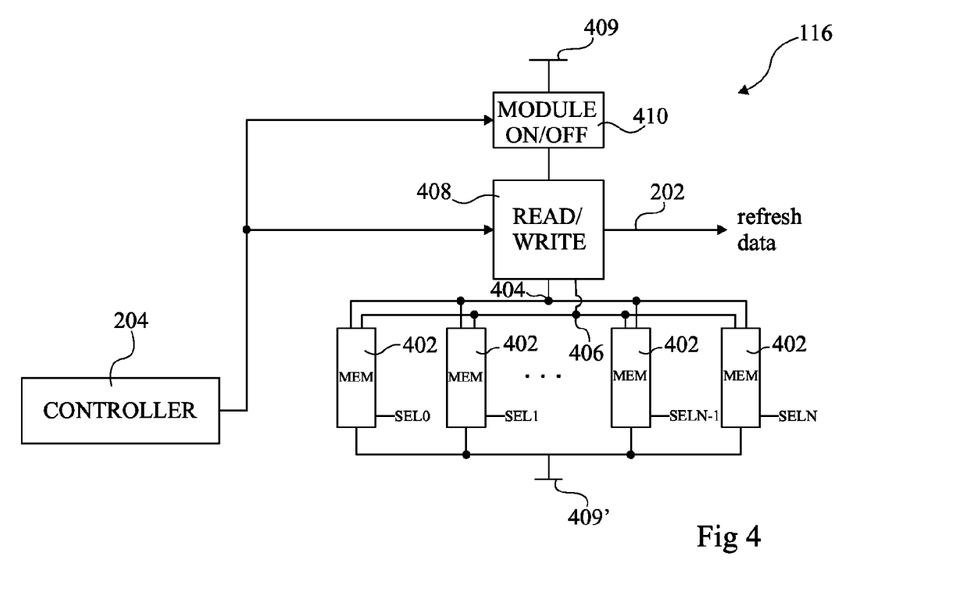
FIG. 4 schematically illustrates a magnetoresistive random access memory (MRAM) of the tile of FIG. 2 in more detail according to an example embodiment.

FIG. 4 illustrates the MRAM 116 of FIG. 2 in more detail according to an example embodiment. As illustrated, the MRAM 116 comprises a series of non-volatile memory cells 402, each of which receives a corresponding one of the selection signals SEL0 to SELN. The memory cells 402 are coupled in parallel to nodes 404 and 406, which are in turn coupled to corresponding inputs of a read/write module 408, which is supplied by a supply voltage rail 409 via an ON/OFF module 410. Furthermore, the memory cells 402 are each coupled to a further supply voltage rail 409'. A positive or negative supply voltage is applied between the rails 409, 409'. In some embodiments, the polarity of this supply voltage may be used to generate a write current through the memory cells 402 in one direction or the other to program the memory cells. Alternatively, the polarity of the supply voltage is constant, and a different technique is used to program the memory cells, as will be described in more detail below.

As illustrated in FIG. 4, the read/write module 408 and the ON/OFF module 410 are controlled by the controller 204. The read/write module 408 provides the refresh data on line 202.

Figure 5A:
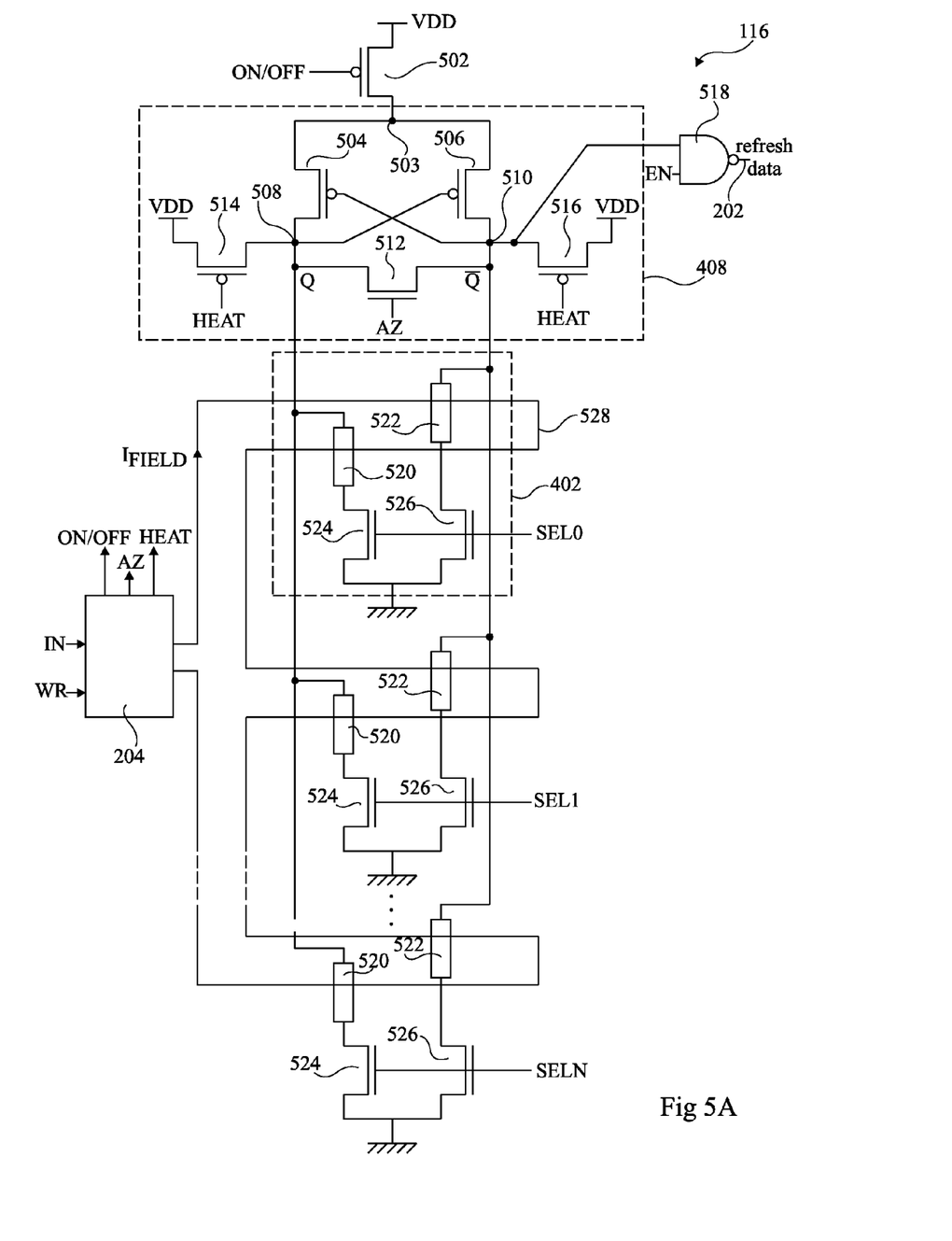
FIG. 5A schematically illustrates the MRAM of FIG. 4 in more detail according to an example embodiment.

FIG. 5A illustrates the MRAM 116 in yet more detail according to an example embodiment in which the supply voltage rail 409 is at VDD, and the memory cells 402 are each coupled to ground. Furthermore, in this example, the memory cells are field-induced magnetic switching (FIMS) elements programmed by a magnetic field, as will be described in more detail below.

As illustrated, the ON/OFF module 410 comprises a PMOS transistor 502, which advantageously has low current leakage, coupled between VDD and a node 503, and which receives at its gate a control signal ON/OFF from the controller 204.

The read/write module 408 comprises a latch formed of a pair of transistors 504, 506, which are for example PMOS transistors. Transistor 504 has its source coupled to node 503, and its drain coupled to a node 508. Similarly, transistor 506 has its source coupled to node 503, and its drain coupled to a node 510. The gate of transistor 506 is coupled to node 508, and the gate of transistor 504 is coupled to node 510. A transistor 512, which is for example an NMOS transistor, is coupled between nodes 508 and 510, and controlled at its gate by a signal AZ supplied by the controller 204. Node 508 is further coupled to the supply voltage VDD via a transistor 514, and node 510 is further coupled to the supply voltage VDD via a transistor 516. Transistors 514 and 516 are for example PMOS transistors, and receive at their gates a signal HEAT from the controller 204.

The node 510 provides the refresh data on line 202, after being provided to a NAND gate 518, which also receives an enable signal EN at its second input.

The nodes 508 and 510 respectively store logic states Q and $\overline{Q}$, and are coupled to the non-volatile memory cells 402. FIG. 5A illustrates an example of these cells. Each cell 402 for example comprises a pair of resistance switching elements 520, 522. Resistance switching element 520 has one terminal coupled to node 508, and another terminal coupled to ground via a transistor 524. Resistance switching element 522 has one terminal coupled to node 510, and another terminal coupled to ground via a transistor 526. The transistors 524, 526 are for example NMOS transistors, and receive at their gates the selection signal SELn, each cell corresponding to one of the volatile memory cells described above.

The resistance switching elements 520 and 522 of each cell 402 are any resistive elements switchable between two resistance values. Such elements maintain the programmed resistive state even after a supply voltage is removed. The resistance switching elements 520, 522 are for example programmed to have opposite values (Rmin, Rmax), and the relative values of the elements indicate one binary data value.

For example, the resistance switching elements 520, 522 are based on magnetic tunnelling junctions (MTJs), such as field-induced magnetic switching (FIMS) elements, thermally assisted switching (TAS) elements, STT (spin-torque-transfer) elements, or those of Toggle MRAM. FIMS-MRAM (magnetic random access memory) are for example discussed in more detail in the publication titled "Magnetoresistive random access memory using magnetic tunnel junctions", S. Tehrani, Proceedings of IEEE, 91(5):3707-714, May 2003. TAS-MRAM are for example discussed in more detail in the publication titled "Thermally Assisted MRAM", Prejbeanu et al.

Alternatively, the resistance switching elements 202, 204 could be other types of memory devices, including resistive memories such as those used in programmable metallization cells (PMC), such as oxide resistive RAM (OxRRAM), conductive bridging RAM (CBRAM) or phase change RAM (PCRAM).

Whatever the type of resistance switching element, information is stored by setting one of the elements at a relatively high resistance ($R_{max}$), and the other at a relatively low resistance ($R_{min}$). Each of the resistance switching elements 520, 522 for example has just two resistive states corresponding to the high and low resistances $R_{max}$ and $R_{min}$, although the exact values of $R_{min}$ and $R_{max}$ may vary depending on conditions such as temperature, process variations etc. The non-volatile data value represented by the resistive elements 520, 522 depends on which of the resistive elements is at the resistance $R_{max}$ and $R_{min}$, in other words on the relative resistances. The resistance elements 520, 522 are for example selected such that $R_{max}$ is always significantly greater than $R_{min}$, for example at least 20 percent greater. In general, the ratio between the resistance $R_{max}$ and the resistance $R_{min}$ is for example between 1.7 and 5 for an MRAM, or more generally between 1.2 and 10000. In one example, $R_{min}$ is in the region of 2.5 k ohms, and $R_{max}$ is in the region of 5 k ohms, although many other values are possible.

In one example, the resistance switching elements 520, 522 are heated by the application of the signal HEAT to transistors 514 and 516, and then programmed by the direction of a magnetic field generated by passing a current $I_{FIELD}$ in one direction or the other through a conducting track 528 passing close to each of the resistance switching elements 520, 522 of each of the cells 402. As illustrated in FIG. 5A, the conducting track 528 is for example coupled to the controller 204, which provides the current for programming the elements.

The controller 204 for example receives a write signal WR indicating when the non-volatile cells 402 are to be programmed, and a data signal IN indicating the data to be programmed in each cell.

Figure 5B:
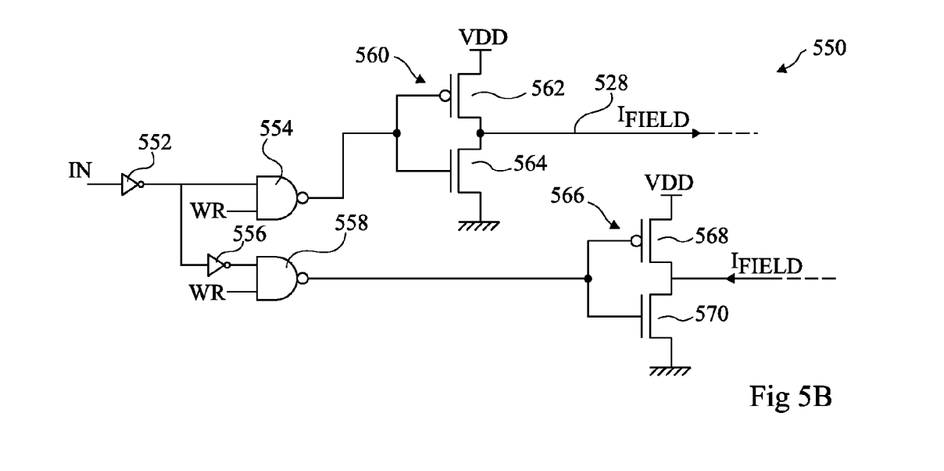
FIG. 5B schematically illustrates write control circuitry of the circuit of FIG. 5A according to an example embodiment.

FIG. 5B illustrates an example of circuitry 550 forming part of the controller 204 for generating the signal $I_{FIELD}$ based on the input signals IN and WR.

As illustrated, the data signal IN is coupled via an inverter 552 to one input of a two-input NAND gate 554, and via inverter 552 and a further inverter 556 to one input of a two-input NAND gate 558. A further input of gates 554 and 558 are each coupled to receive the write signal WR. The output of NAND gate 554 is coupled to an inverter 560 formed of a PMOS transistor 562 and an NMOS transistor 564 coupled in series between the supply voltage VDD and ground. An intermediate node between transistors 562 and 564 is coupled to one end of the conducting track 528. The output of NAND gate 558 is coupled to an inverter 566 formed of a PMOS transistor 568 and an NMOS transistor 570 coupled in series between the supply voltage VDD and ground. An intermediate node between transistors 568 and 570 is coupled to the other end of the conducting track 528.

In operation, when the write signal WR is asserted, a logic low value of the input signal IN will result in a positive current $I_{FIELD}$ flowing from inverter 560 to inverter 566, whereas a logic high value of the input signal IN will result in a negative current $I_{FIELD}$ flowing from inverter 566 to inverter 560.

Figure 6A:
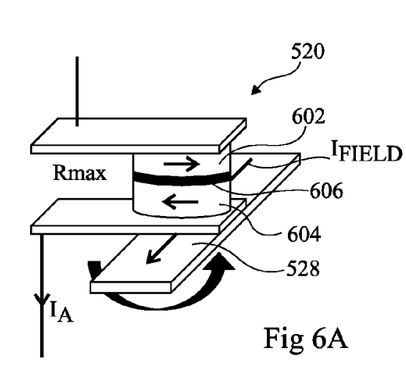
FIGS. 6A and 6B illustrate resistance switching elements of the MRAM of FIG. 5A according to an example embodiment.
Figure 6B:
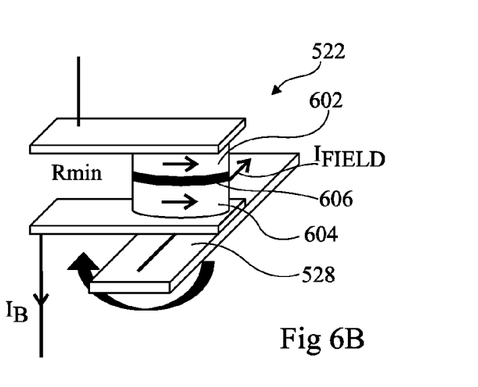

FIGS. 6A and 6B show the resistance switching elements 520, 522 in more detail in the example that they are TAS elements. Each of the resistance switching elements 520, 522 comprises a pinned ferromagnetic plate 602 and a free ferromagnetic plate 604, plates 602 and 604 sandwiching a tunnel oxide layer 606. The conductive track 528 passes close to the free plate 604 of ferromagnetic material, such that it is affected by the magnetic field generated by the current $I_{FIELD}$ flowing through track 528. The pinned plate 602 for example has a magnetic orientation in a first direction, while the magnetic orientation of plate 604 may be programmed, by the polarity of the current $I_{FIELD}$, to be in the same or opposite direction to that of plate 602. However, programming only occurs in elements that have already been heated, as described in more detail below.

FIG. 6A illustrates the case in which the magnetic orientations are in opposite directions in the plates 602, 604, resulting in a maximum resistance $R_{max}$ of the resistance switching element 520, for example in the range 2 k to 5 k Ohms.

FIG. 6B illustrates the case in which the magnetic orientations are in a same direction in the plates 602 and 604, resulting in a minimum resistance $R_{min}$ of the resistance switching element 522, for example in the range of 100 to 3 k Ohms.

The conductive track 528 is arranged such that the current $I_{FIELD}$ passes by each resistance switching element 520, 522 in opposite directions, one of which corresponds to the magnetic orientation of the pinned plate 602, and the other being the opposite orientation. Thus, a same current $I_{FIELD}$ can be used to program both the resistive states of the resistance switching element 520 and 522 at the same time, one of which is equal to $R_{max}$, and the other to $R_{min}$.

Operation of the MRAM 116 of FIG. 5A during a programming phase of the non-volatile memory cells, a read phase of the MRAM, and an off phase will now be described with reference to FIG. 7.

Figure 7:
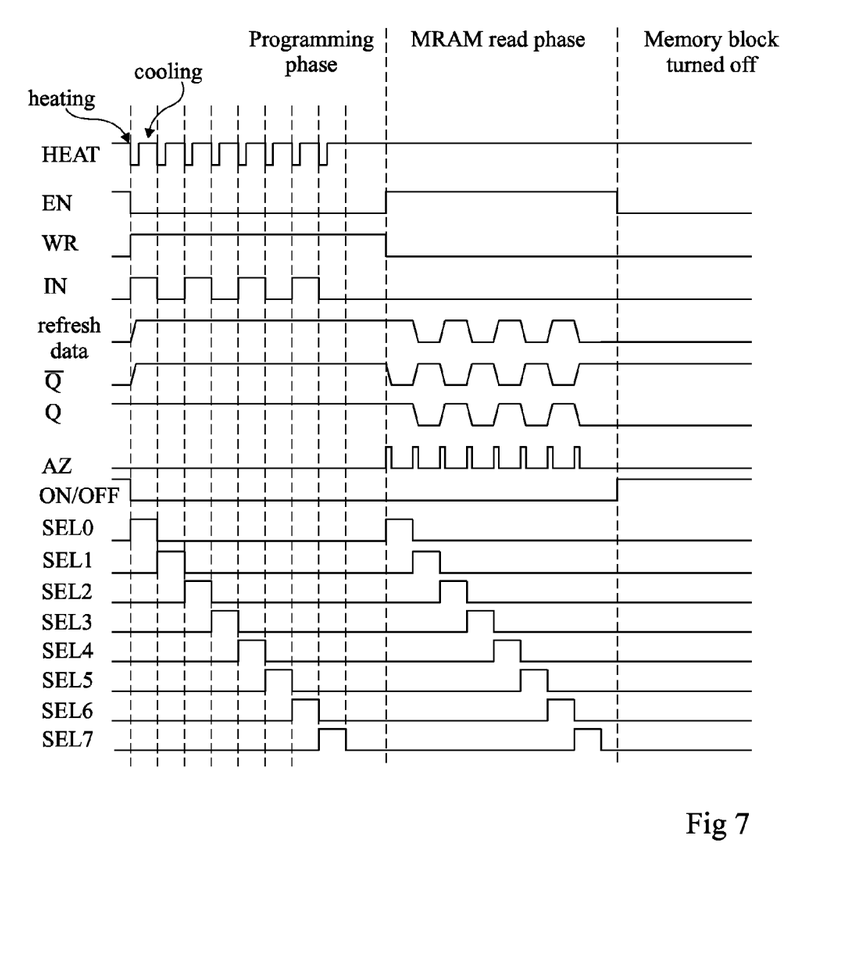
FIG. 7 is a timing diagram showing signals present in the MRAM of FIG. 5A according to an example embodiment.

FIG. 7 is a timing diagram illustrating examples of the signals HEAT, EN, WR, IN, refresh data, Q, $\overline{Q}$, AZ, ON/OFF, and eight selection signals SEL0 to SEL7. The signals HEAT, EN, AZ, ON/OFF and the selection signals are for example generated by the controller 204. It is assumed in FIG. 7 that there are eight non-volatile memory cells 402, and thus 8 corresponding volatile memory cells in the tile to be programmed. In practise there may be many more volatile memory cells storing configuration data, for example hundreds or thousands.

During the programming phase, the signal HEAT goes low to activate the heat transistors 514 and 516, the selection signal SEL0 for the first cell 402 goes high. Thus a heat current flows through the resistive switching elements 520, 522 of the first memory cell 402. At the same time, a high value of the input data signal IN and of the write signal WR causes the current $I_{FIELD}$ to flow in a first direction, programming a corresponding resistive state of the resistance switching elements 520, 522 of the first memory cell 402. The signal HEAT then goes high, and after a cooling period, the selection signal SEL0 goes low, ending the programming phase of the first memory cell. The selection signals SEL1 to SEL7 are then successively activated, and the corresponding memory cells are programmed in a similar fashion, based on successive values of the input data signal IN.

In an alternative embodiment, more than one of the non-volatile memory cells 402 could be programmed at a same time. In particular, in the example of FIG. 7, the memory cells corresponding to selection signals SEL0, SEL2, SEL4 and SEL6 are all to be programmed based on a high logic value of the input signal IN, and thus the selection signals SEL2, SEL4 and SEL6 could additionally be asserted while the selection signal SEL0 is asserted, so that all of these cells are programmed in one go. The remaining memory cells, which are to be programmed based on a low logic value of the input signal IN, could then be programmed together by asserting the selections signals SEL1, SEL3, SEL5 and SEL7 at the same time during a subsequent write operation. Thus all of the elements could be programmed in as few as two write operations. In such an embodiment, the size of each of the transistors 514 and 516 is for example adapted so that they provide sufficient current to heat all of the elements 520, 522 that are to be programmed at the same time. Furthermore, the controller 204 is for example adapted to select the memory cells to which the same data value is to be written.

With reference again to FIG. 7, during the subsequent MRAM read phase, the data stored in the non-volatile memory cells 408 is used to refresh the corresponding configuration data bits in the volatile memory cells. For this, the heat signal remains high, deactivating transistors 514, 516, the signal EN goes high, enabling the output NAND gate 518, and the write signal WR goes low, deactivating the current $I_{WRITE}$. Then, each of the selection signals SEL0 to SEL7 is activated in turn, causing the values of Q and $\overline{Q}$ to assume values depending on which of the resistance switching elements of each memory cell is at resistance Rmin, and which is at Rmax. For example, assuming that in the first memory cell 402, the resistance switching element 520 is programmed to be at Rmax, and the resistance switching element 522 is programmed to be at Rmin, upon activation of the selection signal SEL0, the voltage level $\overline{Q}$ will be pulled low by the low resistance path to ground provided by element 522, whereas Q will stay high, due to the relatively high resistance presented by element 520. Thus the refresh data signal will go high, and the corresponding volatile memory cell, which is also selected by the selection signal SEL0, will be refreshed with this high logic level. At the start of the read operation of each memory cell 402, the transistor 512 is for example activated by the signal AZ for a short period to momentarily equalize the voltages Q and $\overline{Q}$, and aid the transition to the new states determined by the programmed resistances of the elements 520, 522.

During a subsequent off phase of the MRAM, the signal ON/OFF is brought high, thereby deactivating the transistor 502, and the enable signal EN is brought low, bringing low the output refresh data signal. In this state, there is very little energy consumption by the RMAM, but the programmed states of non-volatile memory cells 402 will be maintained.

The MRAM 402 is for example periodically activated and used to refresh the volatile memory cells of the corresponding tile 102 of the reprogrammable memory device. Refreshing for example occurs once every T seconds, where T is between 1 and 100 ms.

Figure 8:
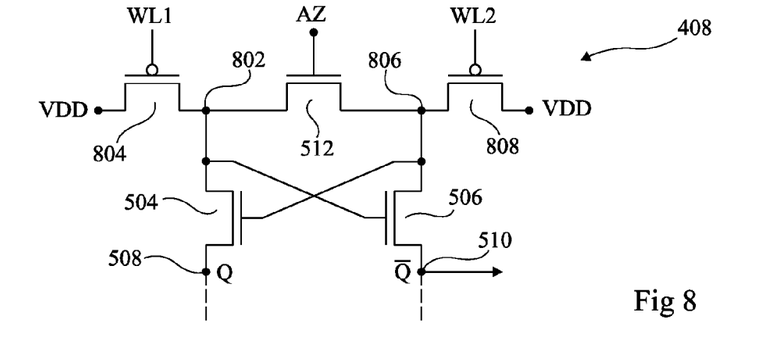
FIG. 8 schematically illustrates a read/write module of the MRAM of FIG. 4 in more detail according to a further example embodiment.

FIG. 8 illustrates the read/write module 408 according to an alternative embodiment in which there is no ON/OFF module or heat transistors. Instead, a node 802 is coupled to the supply voltage VDD via a PMOS transistor 804, and a node 806 is coupled to the supply voltage VDD via a PMOS transistor 808. Transistor 804 is controlled by a signal WL1, while transistor 808 is controlled by a signal WL2. Transistor 504 of the latch is coupled between node 802 and node 508, and has its gate coupled to node 806. Transistor 506 of the latch is coupled between node 806 and node 510, and has its gate coupled to node 802.

The latch formed by transistors 504 and 506 in FIG. 8 is coupled to ground via a selected one of the memory cells 402, but does not comprise a direct connection to the supply voltage VDD. Instead, the transistors 804 and 808 are adapted to have a lower threshold voltage than the transistors 504 and 506. In this way, leakage current through transistors 804 or 808 will maintain a logic high state at one of the nodes 802, 806 when the transistors 804 and 808 are not activated.

Operation of the read/write module 408 of FIG. 8 will now be described in more detail with reference to FIG. 9.

Figure 9:
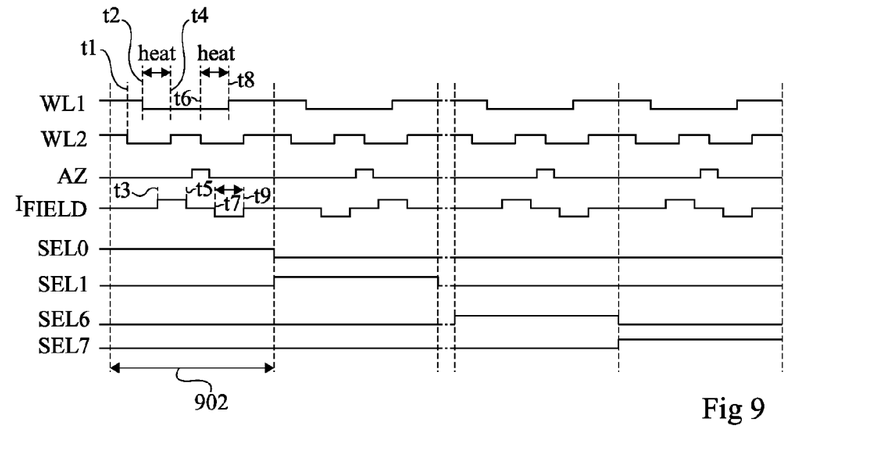
FIG. 9 is a timing diagram showing signals present in an MRAM comprising the read/write module of FIG. 8.

FIG. 9 is a timing diagram showing examples of the signals WL1, WL2, AZ, $I_{FIELD}$ and the selection signals SEL0 to SEL7 during the programming phase of the non-volatile memory cells 402. These signals are for example generated by circuitry of the controller 204. Again it is assumed that there are only eight volatile memory cells storing configuration data in the tile.

Initially, during a first write period 902 for programming the memory cell associated with selection signal SEL0, this selection signal is asserted. The signals WL1 and WL2 are initially high, such that transistors 804 and 808 are not activated. The signal WL2 is then brought low at a time t1, activating transistor 808 and also activating transistor 504. The signal WL1 goes low shortly afterwards at time t2, activating transistor 804, and causing a heating current to flow through the resistance switching element 520. The current signal $I_{FIELD}$ is then asserted at a time t3, in a negative or positive direction depending on the data to be programmed for the element 520. In the example of FIG. 9, the signal $I_{FIELD}$ goes to a positive value, for example corresponding to programming a bit value "1" of the input data signal IN. At a time t4, the signal WL2 goes high, thereby stopping the heating current, and at a time t5, after a cooling off period, the signal $I_{FIELD}$ returns to a neutral level, in which no current for example flows. The signal AZ is then for example briefly asserted, to equalize the voltages Q and $\overline{Q}$, before the signal WL2 goes low again at a time t6, causing a heating current to flow through transistor 506. The signal AZ for example goes low again shortly after the falling edge of the signal WL2. Then, at a time t7, current signal $I_{FIELD}$ is then asserted to program element 522, the current being applied in the opposite direction to direction of the current for programming element 520. Thus the signal $I_{FIELD}$ goes to negative value in the example of FIG. 9. The signal WL1 then goes high at a time t8, stopping the heating current, and at a time t9, after a cooling off period, the signal $I_{FIELD}$ returns to a neutral level, in which no current for example flows. Finally, the signal WL2 goes high, isolating the read/write circuitry from the supply voltage, ready for a programming operation of the next memory cell to be programmed.

This programming procedure is repeated during subsequent write phases for each of the memory cells.

An advantage of the embodiments described herein is that, by using a volatile memory for storing configuration data in each tile of a reprogrammable logic device, and also using a non-volatile memory in the tile comprising a plurality of resistance switching elements to periodically refresh the configuration data, protection from errors caused by radiation can be provided in a simple fashion. Furthermore, it is possible to deactivate the memory when the tile is not being refreshed, or if the tile is not in use, thereby saving energy.

While a number of specific embodiments have been described, it will be apparent to those skilled in the art that there are various modifications that could be applied.

For example, it will be apparent to those skilled in the art that the various transistors that are described as being NMOS transistors could be implemented as PMOS transistors, and vice versa. For example, in the circuit of FIG. 5A, transistor 502 could be an NMOS transistor coupled to ground, rather than to VDD, and the NMOS transistors 524 and 526 could be PMOS transistors coupled to the supply voltage VDD rather than to ground. Furthermore, while the various embodiments have been described in relation to MOS transistors, it will be apparent to those skilled in the art that other transistor technologies could be used, such as bipolar technology.

Furthermore, it will be apparent to those skilled in the art that the ground voltage described herein may be at 0 V, or more generally at any supply voltage $V_{SS}$, that could be different from 0 V and that the ground voltage and supply voltage could be exchanged.

Furthermore, the features described in relation to the various embodiments could be combined in alternative embodiments in any combination.

The invention claimed is:

1. A reprogrammable logic device comprising a plurality of tiles, each tile comprising:
   at least one logic block (108) adapted to perform a logic function, one or more interconnections of the logic block and the logic function applied by the logic block being configurable by configuration data stored by one or more volatile memory cells (322) storing configuration data; and
   a memory (116) comprising:
      a plurality of non-volatile memory cells (402) storing refresh data, each non-volatile memory cell comprising first and second resistance switching elements (520, 522) each programmable to have one of first and second resistance values (Rmin, Rmax) representative of said refresh data; and
      read-write circuitry (408) adapted to periodically refresh said configuration data based on said refresh data at intervals of between 1 and 100 milliseconds.

2. The reprogrammable device of claim 1, wherein said one or more volatile memory cells (322) are DRAM (Dynamic Random Access Memory) cells each comprising a capacitance (334) for storing a voltage state representative of said configuration data.

3. The reprogrammable device of claim 1, wherein each of a first and second of the non-volatile memory cells is coupled to a first and a second node (508, 510) of the read-write circuitry, and the read-write circuitry is adapted to periodically refresh the configuration data of a first of the volatile memory cells based on the refresh data stored by the first non-volatile memory cell, and to periodically refresh the configuration data of a second of the volatile memory cells based on the refresh data stored by the second non-volatile memory cell.

4. The reprogrammable device of claim 1, wherein each of said volatile memory cells comprises a selection transistor (330), and each of said first and second resistance switching elements (520, 522) is coupled in series with a further selection transistor (524, 526).

5. The reprogrammable device of claim 1, wherein a refresh data bit stored by each of said non-volatile memory cells (402) is determined by the relative resistances of the first and second resistance switching elements (520, 522).

6. The reprogrammable device of claim 1, wherein said configuration data controls one or more of:
   the data values in a lookup table (310) of said logic block (108);
   the selection of input lines (104) of said logic block; and
   the selection of output lines (106) of said logic block.

7. The reprogrammable device of claim 1, wherein said memory further comprises an activation module (410) for selectively activating said memory.

8. The reprogrammable device of claim 1, wherein said read-write circuitry (408) comprises a latch comprising first and second transistors (504, 506), wherein a first terminal of the first resistance switching element of each of said plurality of non-volatile memory cells is coupled to said first transistor, and a first terminal of the second resistance switching element of each of said plurality of non-volatile memory cells is coupled to said second transistor.

9. The reprogrammable device of claim 8, further comprising a control circuit (204), wherein said first transistor (504) is coupled between a first storage node (802) and a first supply voltage (GND, $V_{DD}$), said second transistor (506) is coupled between a second storage node (806) and said first supply voltage (GND, $V_{DD}$), a control terminal of said first transistor being coupled to said second storage node, and a control terminal of said second transistor being coupled to said first storage node, and wherein said control circuit is adapted to apply, during a programming phase of the first resistance switching element, a second supply voltage to said second storage node to active said first transistor, and then to apply said second supply voltage to said first storage node to generate a first write current ($I_A$) through said first transistor and said first resistance switching element.

10. The reprogrammable device of claim 9, wherein said control circuit is further adapted to isolate said second storage node from said second supply voltage, and then to apply, during a programming phase of the second resistance switching element, said second supply voltage to said second storage node to generate a second write current ($I_B$) through said second transistor and said second resistance switching element.

11. The reprogrammable device of claim 9, wherein said memory further comprises a third transistor (804) coupling said first storage node to said second supply voltage and a fourth transistor (808) coupling said second storage node to said second supply voltage.

12. The reprogrammable device of claim 11, wherein said third transistor (804) is adapted to have a lower threshold voltage than said first transistor (504) and said fourth transistor (808) is adapted to have a lower threshold voltage than said second transistor (506).

13. The reprogrammable device of claim 9, wherein said read-write circuitry further comprises a fifth transistor (512) coupled between said first and second storage nodes.

14. The reprogrammable device of claim 1, further comprising:
   a plurality of said tiles (102); and
   a controller (204) adapted to control at least the activation of said memory of each of said tiles and the refreshing of the configuration data of each of said tiles.

15. The reprogrammable device of claim 1, wherein said first and second resistance switching elements are one of:
   thermally assisted switching (TAS) elements;
   oxide resistive elements;
   conductive bridging elements;
   phase change elements;
   programmable metallization elements;
   spin transfer torque elements; and
   field-induced magnetic switching (FIMS) elements.

16. A method of refreshing a reprogrammable device comprising a plurality of tiles (102), each tile comprising at least one logic block (108) adapted to perform a logic function, comprising one or more inputs coupled to one or more volatile memory cells (322) storing configuration data, the method comprising:
   periodically refreshing, at intervals of between 1 and 100 milliseconds, said configuration data based on refresh data stored in non-volatile memory cells (402) of a memory (116), wherein each non-volatile memory cell comprises first and second resistance switching elements (520, 522) each programmable to have one of first and second resistance values (Rmin, Rmax).

* * * * *